US006861331B2

(12) United States Patent
Rössiger et al.

(10) Patent No.: US 6,861,331 B2
(45) Date of Patent: Mar. 1, 2005

(54) METHOD FOR ALIGNING AND EXPOSING A SEMICONDUCTOR WAFER

(75) Inventors: Martin Rössiger, Dresden (DE); Thorsten Schedel, Dresden (DE); Jens Stäcker, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/686,848

(22) Filed: Oct. 16, 2003

(65) Prior Publication Data

US 2004/0082085 A1 Apr. 29, 2004

(30) Foreign Application Priority Data

Oct. 16, 2002 (DE) .......................................... 102 48 224

(51) Int. Cl.[7] ............................................. H01L 21/76
(52) U.S. Cl. ..................................... 438/401; 438/975
(58) Field of Search ................................. 438/401, 462, 438/975, 14; 430/5, 30; 355/52, 53

(56) References Cited

U.S. PATENT DOCUMENTS

| | | | | |
|---|---|---|---|---|
| RE33,669 E | * | 8/1991 | Nomura et al. | ............. 356/509 |
| 5,451,479 A | | 9/1995 | Ishibashi | |
| 5,695,897 A | * | 12/1997 | Mitome et al. | ............... 430/22 |
| 6,144,719 A | * | 11/2000 | Hasegawa et al. | ............ 378/34 |
| 6,406,820 B1 | * | 6/2002 | Ota | ............................. 430/30 |
| 6,411,386 B1 | * | 6/2002 | Nishi | ......................... 356/401 |
| 6,563,565 B2 | * | 5/2003 | Nishi | ........................... 355/53 |
| 6,610,448 B2 | * | 8/2003 | Sato et al. | ...................... 430/5 |
| 6,654,096 B1 | * | 11/2003 | Fujita et al. | .................. 355/52 |
| 6,699,630 B2 | * | 3/2004 | Ota | ............................. 430/30 |
| 6,741,732 B2 | * | 5/2004 | Yui | ............................ 382/144 |

OTHER PUBLICATIONS

Jens Staecker et al.: "Advances in Process Overlay on 300 mm wafers", *SPIE Conference*, Mar. 3–8, 2002.
Paul C. Hinnen et al.: Advances in Process Overlay, *SPIE Conference*, Mar. 3–8, 2002.

* cited by examiner

*Primary Examiner*—Long Pham
*Assistant Examiner*—(Vikki) Hoa B. Trinh
(74) *Attorney, Agent, or Firm*—Laurence A. Greenberg; Werner H. Stemer; Gregory E. Mayback

(57) ABSTRACT

Exposure positions of exposure fields of semiconductor wafers are subsequently corrected individually in order to compensate for processes affecting the locational position of alignment marks and/or oblique measurement structures. Measurement structures are formed preferably in the frame region of product wafers comprising electrical circuits to be formed and their locational positions before and after the effect of the process that has an effect are compared individually for purpose of determining the positional displacement for each relevant exposure field. From this there is determined either directly a "shot"-fine correction value for the individual exposure or at least one nonlinear function for the correction in dependence on the position of the measurement structures on the wafer. The corrections are applied to the exposure fields after alignment to the alignment marks overformed by the process in dependence on their position on the wafer.

10 Claims, 3 Drawing Sheets

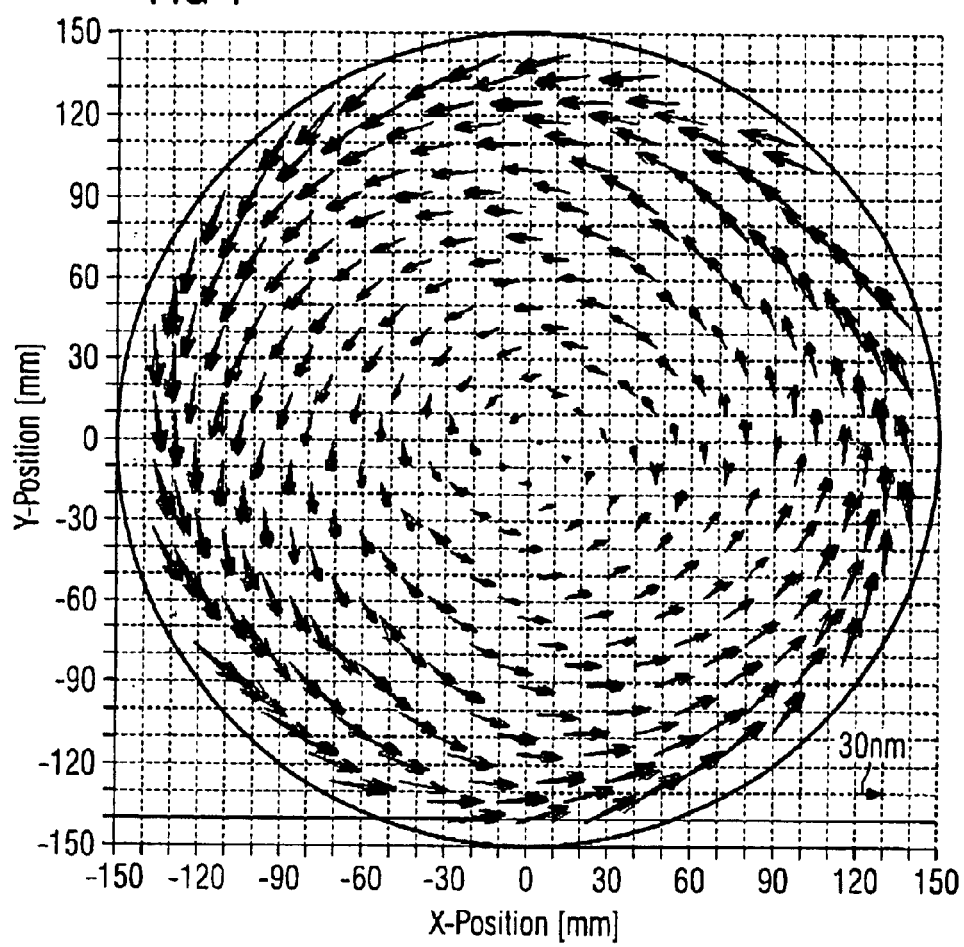
FIG 1
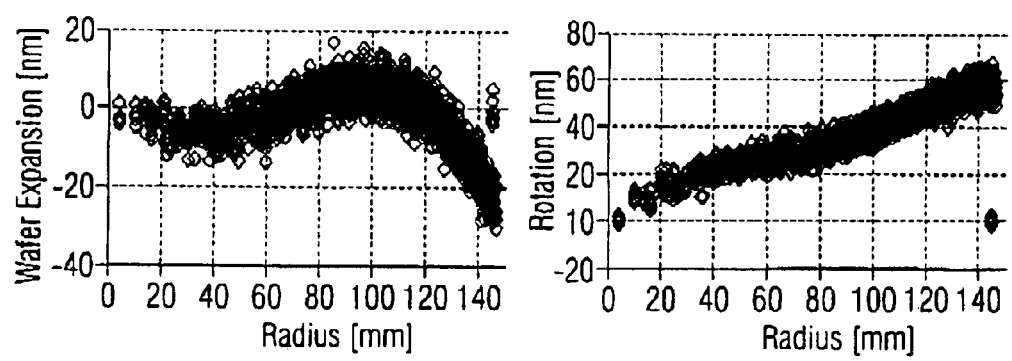

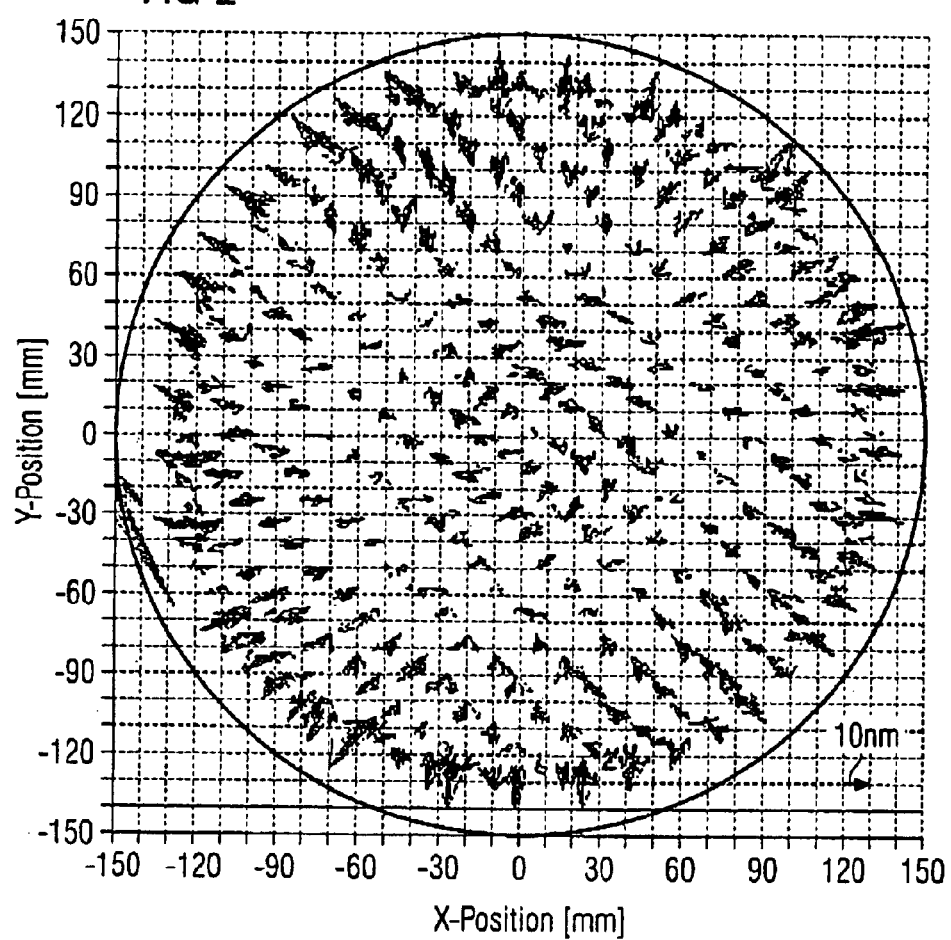
FIG 2
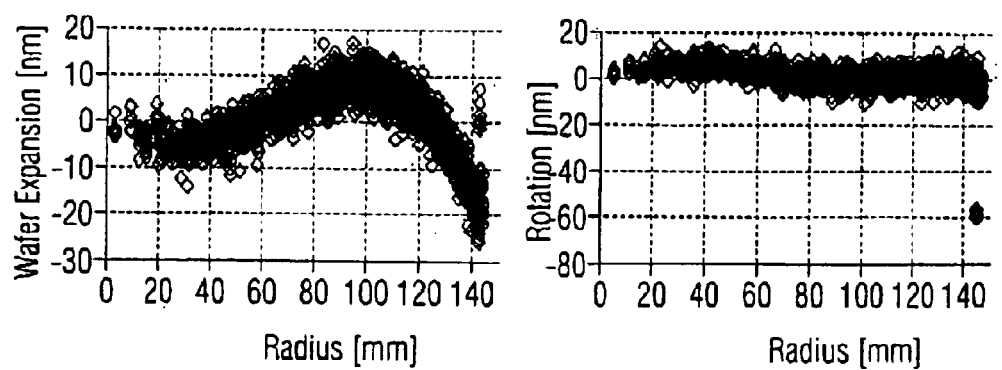

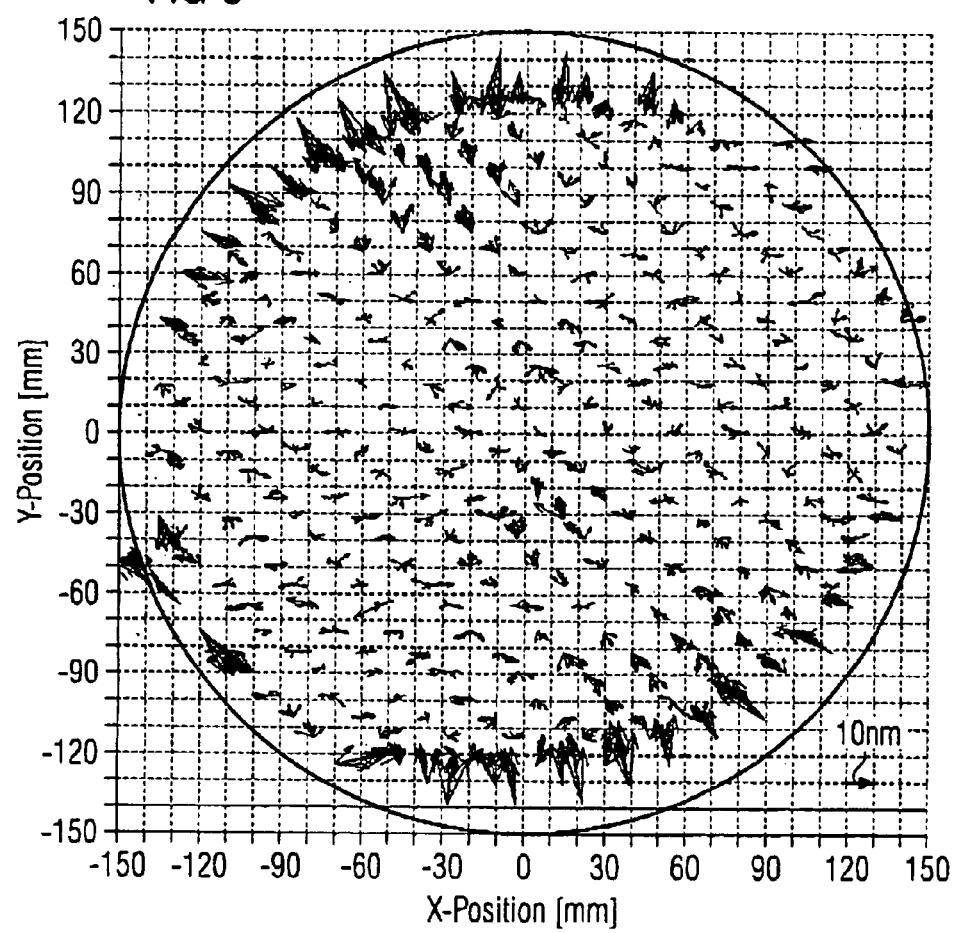
FIG 3
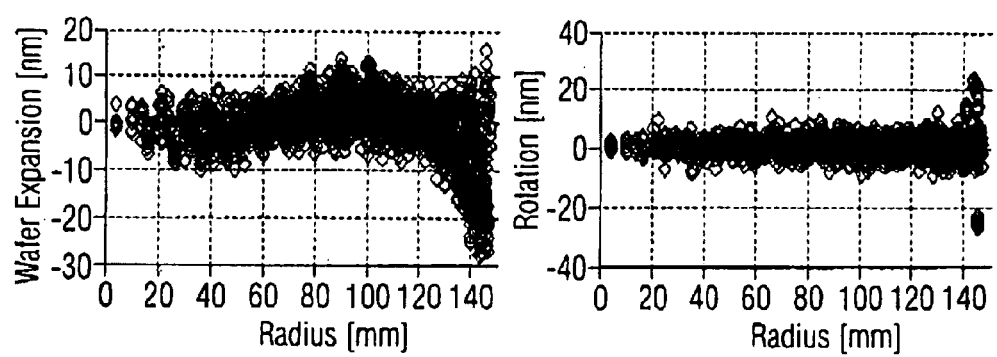

METHOD FOR ALIGNING AND EXPOSING A SEMICONDUCTOR WAFER

BACKGROUND OF THE INVENTION

Field of the Invention

The invention relates to a method for alignment and for exposure of a semiconductor wafer with a structural pattern in an exposure device.

On account of the constantly rising requirements in the fabrication of integrated circuits, the permissible tolerance deviations with regard to the structural widths of the structural elements formed and the relative positional accuracies of structural elements that are formed successively one above the other are becoming increasingly narrower. Therefore, during the lithographic projection of the structures for example from a mask onto semiconductor wafers or other plate-type objects such as, for example flat panels, etc., alignments marked in the x and y directions are patterned on the semiconductor wafers. With the aid of these alignment marks, the structural elements formed in a plane of the circuit can be brought to correspondence, with regard to the positioning, with those structural elements of a further plane which are currently to be formed in a lithographic projection. The substrate holder that receives the semiconductor wafer can generally be moved for this purpose. In this case, alignment marks formed will be compared in the exposure device with e.g. inserted reference marks which represent a positioning of the structural elements to be projected from the mask. The process of orienting the semiconductor wafer is also called alignment.

Before an exposure of a photosensitive resist that has already been applied usually occurs in a lithographic projection step, further physical or chemical processes take place on the semiconductor wafer and thus also on the alignment marks which represent the structures formed in the layer that was applied and patterned last with regard to their position. Said processes may lead to a leveling or deformation for the formation of asymmetries in the alignment marks or else a displacement of the original mark with regard to the newly applied layer. Particularly in the case where asymmetries occur, it is possible for a positional displacement of the center point of one or more alignment marks to be brought about unintentionally.

Examples of physical or chemical processes which may have a disadvantageous effect on the position or the form of an alignment mark are the deposition of layers such as, for instance aluminum or copper, chemical mechanical polishing steps such as, for instance, tungsten or oxide polishing or else resist spin effects during the application of photosensitive resists prior to the actual exposure. The result of the displacement of alignment marks is that the semiconductor wafer, in the exposure device, is oriented to a position which does not correspond to that position of the alignment mark actually concealed under an applied or modeled layer. Rather, the alignment position of the wafer is influenced by the processes affecting the signatures of the alignment marks in a superordinate or modeled layer. In the case of a metal deposition, by way of example, statistical distribution with regard to the positional accuracy with a magnitude of 80–100 nm (3-$\sigma$ error) may occur if no corrections are applied during alignment.

The processes affecting the alignment marks often give rise to signatures which reflect a systematic effect in dependence on the position of the alignment marks on the semiconductor wafer. One example is radial effects which can occur e.g. during the deposition of a layer on the semiconductor wafer. A radial formation of displacement may also occur in polishing installations of specific construction. The further an alignment mark or a structural element is arranged toward the edge of the semiconductor wafer, the greater the extent to which the imaging of the alignment mark or of the element in the deposited layer is displaced towards the edge. A positional displacement in the form of a magnifying imaging of the underlying structures into the current layer takes place (magnification). The extent of these effects, i.e. the extent of the positional alteration of the alignment marks, generally has a linear relationship with the position on the wafer, for example the radius.

Exposure devices such as wafer scanners or wafer steppers are usually provided with the possibility of carrying out linear corrections during alignment for the purpose of exposing individual exposure fields. In this case, it is possible to correct the rotation, the translation, the aforementioned magnification and the wafer skew. On the basis of global alignment parameters, the corresponding corrections are performed in dependence on the position of the exposure field on the wafer.

These linear corrections have made it possible to considerably reduce the 3-$\sigma$ errors in the x and y directions on the wafer. Using the aforementioned example of metal deposition, the corresponding error values for the positional accuracy have been able to be reduced to about 20 nm, for example. However, on account of the further increasing requirements with regard to the positional accuracy to be achieved, even these reduced values will be reached by prescribed tolerance limits in the near future.

SUMMARY OF THE INVENTION

Therefore, the object of the present invention is to provide a method which enables further reduction of the residual error in the positional accuracy of a lithographic patterning process which stems from effects of processes carried out in chemical, mechanical or physical fashion on the alignment marks of a semiconductor wafer.

The object is achieved by means of a method for alignment and for exposure of a semiconductor wafer with a structural pattern in an exposure device, comprising the following steps:

a) provision of the semiconductor wafer with at least one exposure field, on which a first layer is arranged, in which is formed in each case at least one alignment mark for aligning a semiconductor wafer in the exposure device for exposure of the exposure field, b) formation of a measurement structure with a first locational position in the exposure field in the first layer, c) application of a chemical or physical process at least to the exposure field with the measurement structure, d) measurement of a second locational position of the measurement structure after the application of the process, f) comparison of the first and second locational positions for determining a difference which characterizes the influence of the applied process on the first distance in the exposure field, g) loading of the semiconductor wafer into the exposure device and alignment of the semiconductor wafer using the at least one alignment mark for defining an exposure position for the exposure field, h) correction of the exposure position of the exposure field in the exposure device depending on the difference for compensating for the influence of the applied process, i) carrying out of the exposure with the corrected exposure position, k) repetition of steps a) to i) for correction of at least two further exposure fields, the corrections respectively applied having a nonlinear dependence on the position of the first and of the in each case at least one further exposure field on the semiconductor wafer.

For the exposure of individual exposure fields, individual corrections of exposure positions—initially aligned with alignment marks—of individual exposure fields, in an exposure device, are carried out, on the basis of residual errors that have remained, differently from the corrections that are to be applied to respectively adjacent exposure fields. In this case, the correction may be selected in dependence on the position of the exposure field on the semiconductor wafer. In particular, a nonlinear function of the position on the semiconductor wafer is selected for the scope of the correction.

If a magnification or rotation with a global—i.e. valid for the entire semiconductor wafer, magnification/reduction or rotation value were carried out in accordance with the prior art, then according to the invention, in dependence on the location on the wafer, for example the radius distance from the center point of the wafer, each exposure field is assigned an individual correction value and the alignment is carried out using the latter. Nonlinear, systematic effects which influenced the residual error by virtue of their not previously being taken into account in accordance with the prior art can thereby advantageously be eliminated or at least considerably reduced.

The method according to the invention provides for further measurement structures or marks to be formed in addition to the alignment marks for carrying out the alignment in the exposure device, said further measurement structures for marks subsequently being examined in order to determine the positional alteration due to the process that has an effect, for example in a specific microscope measuring device. The measurement structures are firstly formed in the first layer, in which the alignment marks are also formed. In order to be able to individually correct exposure fields, alignment and measurement structures are in each case formed in the first layer in the relevant exposure fields. Depending on whether a second layer is applied by means of a deposition process or the first layer present is subsequently modeled by means of a polishing process etc., the locational position of the measurement structure formed, which position was previously prescribed in a lithographic step, is compared with the locational position measured after the process has been carried out, by means of the microscope measuring device.

The exposure position is the position of the exposure field to be exposed relative to the beam of the projection apparatus. It corresponds to a coordinate setting of a substrate holder which can be moved in the XY plane and on which the semiconductor wafer is mounted during an exposure. An alignment (step g) with the alignment marks results in the recording of the alignment mark positions in the system of coordinates of the substrate holder. A correction according to the invention (step h) of the exposure position captured at said alignment mark positions takes place for example by the alignment mark positions being altered data-technologically by the difference determined in step (f) converted to the system of coordinates of the substrate holder. The new alignment mark positions that have been changed data-technologically are used to move the substrate holder for the purpose of setting the exposure position.

According to the invention, the linear, global correction carried out previously is replaced by a nonlinear correction.

In addition to the derivation of such a nonlinear function from the measurements (step f), in which there is still a functional dependence of the correction of an exposure field on an adjacent exposure field, one refinement of the invention also provides for the exposure fields to be individually corrected completely independently of one another, that is to say a "shot"-fine correction.

This is possible by means of various methods in accordance with various refinements. One method consists in using a scanning electron microscope (SEM) to examine in detailed fashion the topography modeled, i.e. overformed, by the process and to compare it with reference positions.

As an alternative, it is also possible to form a measurement structure comprising a plurality of partial structures, i.e. first and second measurement structures, of which only e.g. the first partial measurement structure is etched free in an etching process. The original measurement structure situated at a deeper level can thus be detected by the measuring device. It is then compared with the modeled measurement structures. What is important in this case is that the distance between the partial measurement structures is already known during the formation of the measurement structures. Therefore, in the subsequent measurement process for determining the locational positions, once again only the relative distance between the etched-free and the non-etched partial structures need be measured in order to be able finally to compare said relative distance with the original, lithographically patterned distance. The resultant difference numbers the extent of the positional displacement due to the process that has an effect. The proposed measurement structure with uncovered and non-uncovered partial structures is also called intrinsic box.

The process that has an effect may be e.g. deposition processes such as CVD (chemical vapor deposition), PECVD (physically enhanced CVD), etc. An epitaxial layer growth is also conceivable. A further process that has an effect relates to chemical mechanical polishing (CMP). The application of photosensitive resist layers (resists), for example, is also included.

In accordance with a particularly advantageous refinement of the present invention, the alignment for the lithography step that follows the process is carried out for each exposure field in such a way that the measured difference, for example comprising a magnitude and a direction as vector, is used directly as a correction value, the sign of the direction vector being precisely converted merely for the purpose of compensating for the positional displacement, so that the direction vector points in precisely the opposite direction with the same magnitude. However, this correction is only employed after an alignment with the alignment marks that have been overformed to the same extent as the measurement structure has been carried out in the first or second layer. The first exposure position determined therefrom is readjusted by the correction value—in this refinement the direction vector opposite to the vector of the difference—in order to determine a second exposure position.

The method thus proposed enables a reduction of errors through the position-dependent correction of the exposure fields after an alignment with overformed alignment marks with the aid of a measurement process that is carried out before the carrying out of a lithographic projection step for the processing of the same wafer. The present invention thus corresponds to an advanced process control (APC) method. It can advantageously be combined with other methods in which corrections of parameters in the lithography step are carried out from a previous measurement of a characteristic quantity on the wafer. By way of example process parameter fluctuations in the lithographic track can be used to find compensation values for exposure parameters which are then applied to the same wafer.

In accordance with a further refinement of the present invention, the corrections for the consequences of a process applied to the wafer may also be applied to a subsequent, later wafer. This is appropriate particularly when either long-term effects occur on account of the process carried out or, alternatively, device dependent systematic effects occur which, for the relevant device, always recurrently lead to the same signature or overforming of the alignment and measurement structures. In the latter case, the determination of the locational positions after the overforming process would then not have to be carried out every time for the relevant exposure fields. Rather, the data, once recorded in an installation monitoring test, for example, could be stored in a database and be retrieved in an exposure step for the relevant exposure field which has the same position on the semiconductor wafer and has experienced the process in the same process device.

Long-term effects occur for example in metal planes which arise as a result of preferred directions during the deposition in an installation. Said preferred directions depend on the respective technical construction of the installations.

Thus, in accordance with this aspect, the method steps for determining the difference and the method steps for applying the difference to a correction of the alignment of the exposure field are carried out at separate, first and second semiconductor wafers because the production of the product will generally not be able to be stopped long enough to be able to check the same wafer for said positional displacement.

The invention will now be explained in more detail using an exemplary embodiment with the aid of a drawing, in which

BRIEF DESCRIPTION OF THE DRAWINGS

FIG. 1 shows a map of the positional displacement on a semiconductor wafer in plan view (top) and in diagrams (bottom) separately according to radial expansion and tangential rotation components: after the deposition of a metal layer and after subsequently uncorrected exposure in accordance with the prior art, FIG. 2 shows the same as FIG. 1 but after the application of a linear correction—global for the wafer—of the alignment in accordance with the prior art, FIG. 3 shows the same as FIG. 1 but after the application of an individual nonlinear correction for each exposure field in accordance with the present invention.

DESCRIPTION OF THE PREFERRED EMBODIMENTS

A metal layer is to be deposited on an interlayer dielectric and subsequently be subjected to chemical mechanical polishing. A lithographic patterning in an exposure step is subsequently envisaged.

The semiconductor wafer is provided, and it already has alignment marks and also measurement structures in the interlayer dielectric as first layer. The deposition process and the polishing process for the purpose of forming a second layer are carried out. All the structural elements and also the alignment and measurement structures are overformed by the deposition and polishing process. However, the alignment and measurement structures are still discernible in the topmost layer for carrying out an overlay measurement and also an alignment.

The semiconductor wafer is then etched free at partial regions of the measurement structures using a free-exposure mask in a further exposure device. As a result, parts of the original measurement structures in the underlying layer, the interlayer dielectric, become visible for carrying out a measurement in an overlay measuring microscope.

The distance between the etched-free and the non-etched-free structures is measured in the overlay measuring device. In a further step, this measured distance is compared with the originally known distance between the partial structures within the interlayer dielectric. The difference between the two distances represents the positional displacement in the X and Y directions.

For all the exposure fields provided with the measurement structures the measured differences are recorded in the measuring device. The maps and diagrams shown in FIGS. 1–3 illustrate how the differences affect the exposure step that is then to be carried out—depending on whether a higher-order or "shot"-fine nonlinear correction according to the invention is applied (FIG. 3), whether a global linear correction is applied (FIG. 2) or whether no correction at all is applied (FIG. 1).

The top part of FIGS. 1 to 3 in each case shows in a plan view of a 300 nm wafer the positional displacement of measurement structures which has resulted from a metal plane deposition process. These representations concern measurement structures extended over at least two planes, namely the metal plane and the underlying layer plane. The positional displacements identified by the arrows represent the difference between the partial structures patterned in the two planes after the deposition step and the lithography step. Thus, what are involved in this case are not the measurement structures according to the invention, but rather measurement structures for representing the result of the method according to the invention. The arrow lengths correspond to the magnitudes of the positional displacements. A scale is depicted in each case at the bottom right in the top map in FIGS. 1–3.

FIG. 1 shows the case in which no correction of the exposure positions at all was applied in the alignment for carrying out an exposure step (prior art).

As can be seen in the top part of FIG. 1, a rotation-like displacement of the measurement structures and thus assumedly also of the structural elements of a relevant circuit takes place during the metal plane deposition process. The rotation is essentially linear, as can be seen in the bottom part of FIG. 1. The individual measured values for the positional displacement are plotted as a function of the radius position of the relevant measurement structure.

The test wafer illustrated in FIG. 1 has a 3-σ residual error of positional accuracy (overlay) of 90.2 nm in the X direction and 88.6 nm in the Y direction.

As is also shown in the bottom part of FIG. 1, the radial components (wafer expansion) as a function of the radius form a nonlinear relationship.

FIG. 2, in a form of illustration analogous to FIG. 1, illustrates the case in which a linear correction method in accordance with the prior art was applied for the alignment of the wafer covered with a metal layer during the exposure. For this purpose, an average rotation of −0.399 ppm was determined from all the measured values and used as a global parameter on the totality of the exposure fields for the correction during the alignment in an exposure device. As can be seen in the bottom part of FIG. 2, the rotation could thus essentially be corrected, so that all that remains is a statistical variation in the totality of the values.

A further parameter, the magnification, was likewise determined from the original data such as, for example, the data shown in FIG. 1, which parameter can be used to correct radial effects. For the magnification in the X and Y direction, values of 0.032 and 0.038 ppm, respectively were found and likewise also apply to the exposure for correction purposes. The corresponding diagram in FIG. 2, bottom part, shows that only little change in the radial profile of the radial displacement effects is manifested, however, as a result of this linear correction. Although a systematic effect is evidently present, the previous correction method cannot prevent this systematic effect from influencing the residual error. In accordance with this method, the 3-σ residual error is still 19.0 nm in the X direction and 19.2 nm in the Y direction.

FIG. 3 shows the result after the method according to the invention has been applied to the semiconductor wafer processed in the same way as in FIGS. 1 and 2. In this case, using an intrinsic box on the semiconductor wafer, the state in FIG. 1 was determined in a measurement and the individual exposure fields were corrected in accordance with the resultant difference during the alignment or an exposure. For simplification, for the present example, a radial function proceeding from the wafer center point was determined by averaging and with inverted signs, yields the correction values. The averaging was effected over an angle of 360° for a given wafer radius. For each exposure field position, e.g. the center point of an exposure field, the corresponding function value could be read and accounted to the alignment after the alignment with the overformed alignment marks.

The top part of FIG. 3 clearly reveals that the individual positional alterations only exhibit a statistical variation, with the exception of two edge regions in the upper and lower parts of the semiconductor wafer. This last is caused by the fact that no tangential correction was carried out.

The bottom part of FIG. 3 reveals that both the radial and the tangential effects (rotation) were essentially corrected. In order to achieve this success, a displacement (translation), magnification, rotation, etc. must be calculated and applied individually for each exposure field. As a result, application of the method according to the invention yields a 3-σ residual error of 13.4 nm in the X direction and, respectively, 16.6 nm in the Y direction. A distinct improvement can thus be ascertained.

A direct application of the difference measured for an exposure field in the first method steps—provided with a negative sign—as correction value for the alignment steps yields a further improvement if the method according to the invention is applied in the context of an advanced process control (APC) strategy for the same wafer for which the values were also measured.

We claim:

1. A method for aligning and exposing a semiconductor wafer with a structural pattern in an exposure device, which comprises the following steps:
   a) providing the semiconductor wafer with at least one exposure field having a first layer formed with at least one alignment mark for aligning the semiconductor wafer in the exposure device for exposure of the exposure field;
   b) forming a measurement structure with a first locational position in the exposure field in the first layer;
   c) subjecting the exposure field with the measurement structure to a chemical or physical process;
   d) subsequently measuring a second locational position of the measurement structure;
   e) comparing the first and second locational positions for determining a difference characterizing an influence of the chemical or physical process on the measurement structure in the exposure field;
   f) loading the semiconductor wafer into the exposure device and aligning the semiconductor wafer via the at least one alignment mark for defining an exposure position for the exposure field;
   g) correcting the exposure position of the exposure field in the exposure device in dependence on the difference for compensating for the influence of the chemical or physical process;
   h) exposing with the corrected exposure position;
   i) repeating steps a) to h) for correcting at least two further exposure fields, with respective corrections having a nonlinear dependence on the position of the first exposure field and of the at least one further exposure field on the semiconductor wafer.

2. The method according to claim 1, wherein the step of correcting the exposure position of the exposure fields in each case comprises correcting equal to the difference in magnitude and opposite to the difference in direction.

3. The method according to claim 1, wherein the chemical or physical process on the semiconductor wafer is a chemical mechanical polishing process.

4. The method according to claim 1, wherein the chemical or physical process is a deposition process for depositing a second layer in such a way that the measurement structure is discernible in the second layer.

5. The method according to claim 1, which further comprises:
   forming a second measurement structure at a first distance from the first measurement structure in the exposure field in the first layer;
   after deposition of a second layer, etching the second measurement structure free in an etching step from the second layer for defining a reference structure;
   determining a second distance between the first measurement structure in the second layer and the second structure in the first layer during a measurement of the second locational position; and
   comparing the first distance with the second distance during the comparison for determining the difference.

6. The method according to claim 1, which comprises measuring the locational positions with a scanning electron microscope.

7. The method according to claim 1, which comprises measuring the locational positions by determining the electrical resistance of a measurement structure.

8. The method according to claim 7, which comprises forming the first and second measurement structures in a kerf region of the exposure field comprising at least one electrical circuit to be formed.

9. A method for aligning and exposing a first semiconductor wafer with a structural pattern in an exposure device, the method which comprises the following steps:
   a) providing a second semiconductor wafer with at least one first exposure field, a first layer on the first exposure field, and at least one alignment mark for aligning a semiconductor wafer in an exposure device for exposing the exposure field;
   b) forming a measurement structure with a first locational position in the first exposure field in the first layer;

c) subjecting the exposure field with the measurement structure to a chemical or physical process;

d) subsequently measuring a second locational position of the measurement structure;

e) comparing the first and second locational positions for determining a difference characterizing an influence of the chemical or physical process on the measurement structure in the exposure field;

f) providing the first semiconductor wafer with a second exposure field for carrying out an exposure in an exposure device, the second exposure field having a same relative position on the first semiconductor wafer as the first exposure field on the second semiconductor wafer;

g) aligning the first semiconductor wafer using the at least one alignment mark for defining an exposure position for the second exposure field;

h) correcting the exposure position of the second exposure field in the exposure device depending on a determined difference for compensating for an influence of the chemical or physical process;

i) correction the exposure position of the exposure field in the exposure device depending on the determined difference for compensating for an influence of the chemical or physical process;

k) repeating steps a) to i) for correcting at least two further exposure fields, the respective corrections having a nonlinear dependence on the position of the respective exposure field on the first semiconductor wafer.

10. The method according to claim 9, which comprises correcting the exposure position of the second exposure fields in each case equal to the difference in magnitude and opposite to the difference in direction.

* * * * *